(12) United States Patent
Hon et al.

(10) Patent No.: US 7,119,374 B2
(45) Date of Patent: Oct. 10, 2006

(54) GALLIUM NITRIDE BASED LIGHT EMITTING DEVICE AND THE FABRICATING METHOD FOR THE SAME

(75) Inventors: Schang-Jing Hon, Pa Te (TW); Mu-Jen Lai, Chungli (TW)

(73) Assignee: Supernova Optoelectronics Corp., Taoyuan (TW)

( * ) Notice: Subject to any disclaimer, the term of this patent is extended or adjusted under 35 U.S.C. 154(b) by 232 days.

(21) Appl. No.: 10/781,766

(22) Filed: Feb. 20, 2004

(65) Prior Publication Data
US 2005/0263779 A1   Dec. 1, 2005

(51) Int. Cl.
*H01L 33/00* (2006.01)

(52) U.S. Cl. .............. 257/94; 257/88; 257/98
(58) Field of Classification Search ........... 257/88–103
See application file for complete search history.

(56) References Cited
U.S. PATENT DOCUMENTS 6,194,742 B1 *  2/2001  Kern et al. .................. 257/96
6,521,999 B1 *  2/2003  Uemura et al. .............. 257/99
6,563,139 B1 *  5/2003  Hen ............................ 257/89

FOREIGN PATENT DOCUMENTS

TW    419837    1/2001
TW    558848    10/2003

* cited by examiner

Primary Examiner—Cuong Nguyen
(74) Attorney, Agent, or Firm—Rosenberg, Klein & Lee

(57) ABSTRACT

A GaN-based light-emitting device and the fabricating method for the same are described. The light-emitting device is a light-emitting body with a light extraction layer thereon. The light-emitting body has some GaN-based layers and is capable of emitting a light when energy is applied. The light extraction layer is a double layered structure having a current spreading layer and a micro-structure layer, or a single layered structure without the current spreading layer. The micro-structure layer is a TiN layer with a nano-net structure obtained by nitridation of a Ti layer or a Pt layer with metal clusters thereon obtained by annealing of a Pt layer.

5 Claims, 8 Drawing Sheets

GALLIUM NITRIDE BASED LIGHT EMITTING DEVICE AND THE FABRICATING METHOD FOR THE SAME

BACKGROUND OF THE INVENTION

1. Field of Invention

The present invention is related to an improvement of luminous efficiency of a gallium nitride (GaN) based light-emitting diode (LED). in particular, the present invention is related to a GaN LED with a metal micro-structure as a light extraction layer and a manufacturing method for the same.

2. Related Art

Semiconductor light-emitting diodes (LEDs) have been developed for several decades and the luminous efficiency thereof plays a key role in whether LEDs may be further applied in lighting facilities generally used in ordinary living. Therefore, LED research, for the past decades, has been focused on improvement of luminous efficiency. Generally, luminous efficiency varies with the following factors: semiconductor material adopted, device structure devised, transparency of material used, total reflection existed, etc.

Of the semiconductor LEDs, a gallium nitride (GaN) based material may be the most commonly used. To let the GaN-based material irradiate light, a voltage or a current has to be applied to the corresponding LED. To apply a voltage or a current to the LED, a pair of positive and negative electrodes are disposed on the LED structure.

The positive electrode is also called a p-electrode while the negative electrode is also called an n-electrode, since charges provided by the p-electrode first flow into a p-type semiconductor material layer and charges supplied by the n-electrode first flow into an n-type semiconductor material layer. The p-type electrode is where positive charges flow into the LED structure, and holes are carriers for conductivity. On the other hand, the n-type electrode is where negative charges flow into the LED structure, and electrons are carriers for conductivity. Owing to the poorer mobility of the hole carriers as compared to the electron carriers, a current spreading layer is generally disposed under the p-type electrode so that the hole carriers may be uniformly distributed in the p-type semiconductor layer. In this case, electric force lines between the p-type electrode and the n-type electrode may also be uniformly distributed so as to enhance excitation of light in the LED. The afore-mentioned current spreading layer may be any suitable material, and a Ni/Au double layered structure is the most commonly used. Referring to FIG. 1, which illustrates an LED structure 10, the LED structure 10 comprises a substrate 11, a buffer layer 12, an n-type GaN-based layer 13, a semiconductor active layer 14, a p-type GaN-based layer 15, a p-type semiconductor layer 16, a current spreading layer 17 and a p-type electrode 18. The process thereof may be found in ROC patents 558848, 419837, etc. In the figure, the current spreading layer 17 is disposed between the p-type semiconductor layer 16 and the p-electrode 18 and used to distribute uniformly positive charges thereon and then enter into the p-type semiconductor layer 16.

However, a serious total reflection issue is closely related to the current spreading layer since the current spreading layer has flat surface and thus reflects light back to the LED structure and has a poor light extraction. Some technologies for roughening the current spreading layer are provided. For example, roughening structures are disposed where the emitted light is output so that most emission angles of the emitted lights are smaller than a critical angle, which is defined by Snell's Law. These roughening structures are generally shaped as hemispheres or truncated pyramids. However, these roughening shapes are hard to form and may be expensive.

Other roughening technologies are available. For example, an etch process is applied onto the upper flat surface of the LED to form small, roughened facets on the flat surface so that most emission angles of emitted light may output without reflection to the LED structure. Such a roughening method comprises a process of randomly etching a surface. For example, particles are deposited on the surface and then used as masks in the random etching. However, there are at least two major disadvantages. First of all, some small islands may exist in the p-type electrode. Since the lower parts of the island structures do not contact the p-type electrode contact, no light will be emitted by these portions and the total light output is reduced. Second, since the upper surface of the LED structure is very close to the light-generating area below, the light generating area may be very likely broken.

In view of the disadvantages of the prior GaN-based LED, there is a need to provide a GaN-based LED with high light extraction efficiency.

SUMMARY OF THE INVENTION

The present invention is aimed to provide a GaN-based LED with high light extraction efficiency and a method for manufacturing the GaN-based LED.

In view of the purpose above, a micro-structure surface is formed on a current spreading layer of the GaN-based LED structure according to the present invention. With the micro-structure, a total reflection of light associated with the current spreading layer is reduced and the corresponding luminous efficiency is improved.

The LED structure with the micro-structure according to the present invention has two primary embodiments. In the first embodiment, a TiN layer is formed on the current spreading layer and the two layers jointly form a light extraction double layered structure. The double structure is disposed on a light-emitting body. The TiN layer has a micro-structure and the micro-structure is a nano-net structure. With the nano-net structure, lights generated by an active layer in the light-emitting body are more immune to total reflection.

In the first manufacturing embodiment according to the present invention, a GaN-based light-emitting body is first formed, a current spreading layer is next formed on the light-emitting body, and a Ti layer is formed on the current spreading layer. Next, the Ti layer is subjected to nitridation so that a TiN micro-structure surface with a nano-net structure is formed.

In the second manufacturing embodiment according to the present invention, a GaN-based light-emitting body is first formed, a current spreading layer is next formed on the light-emitting body, and a Pt layer is formed on the current spreading layer. Next, the Pt layer is annealed so that a Pt micro-structure surface with metal clusters is formed.

BRIEF DESCRIPTION OF THE DRAWINGS

The present invention will become more fully understood from the detailed description given hereinbelow for illustration only, and thus are not limitative of the present invention, and wherein.

DETAILED DESCRIPTION OF THE INVENTION

The present invention provides a light extraction layer with a micro-structure surface to reduce total reflection of light and enhance a light extraction efficiency of the light extraction layer, which is illustrated below.

Figure 1:
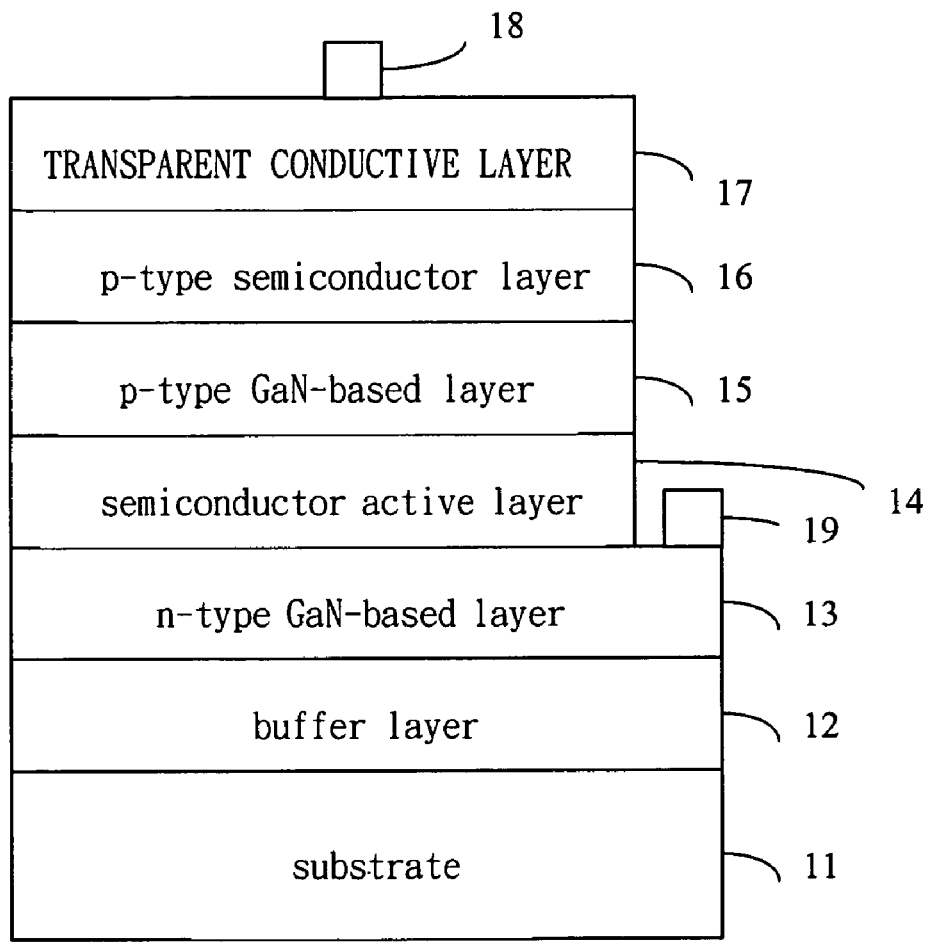
FIG. 1 is a front view of a prior gallium nitride (GaN) based light emitting diode (LED)
Figure 2:
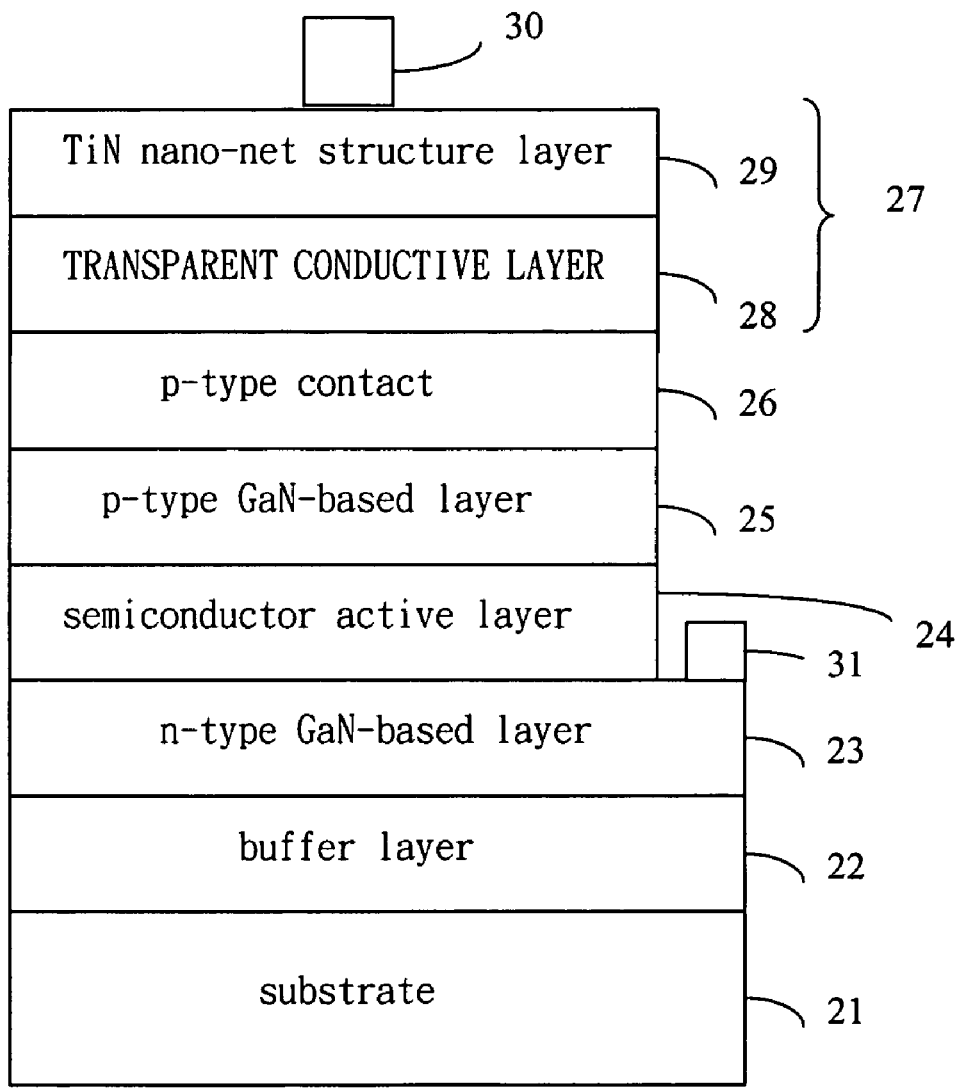
FIG. 2 is an illustration of a first device structure embodiment according to the present invention.

The gallium nitride (GaN) light-emitting device (LED) primarily comprises two major embodiments. Referring to FIG. 2, which illustrates a first device structure 20 embodiment according to the present invention, a substrate 21 is first prepared, which may be sapphire, GaN or SiC or other suitable materials. An n-type GaN-based layer 23, a semiconductor active layer 24 and a p-type GaN-based layer 25 are sequentially formed over the substrate 21 to generate light when a voltage or a current is applied. The three layers 23, 24, 25 comprise a light-emitting body.

The semiconductor active layer may be an AlGaNInN layer or an InGaN/GaN layer. The substrate 21 and the n-type GaN-based layer 23 may be selectively disposed on a buffer layer 22 to let the two layers 21, 23 adjacent to the buffer layer 22 have better lattice matching. A p-type contact layer 26 and a light extract layer 27 are sequentially disposed over the contact layer 26. The contact layer 26 may be p-InGaN or p-AlInGaN layer and the light extraction layer 27 is a double layer structure composed of a current spreading layer 28 and a micro-structure layer 29.

The current spreading layer 28 is made of transparent and conductive material and is at least a Ni/Au double layered structure, Ni, Pt, Pd, Rh, Ru, Os, Ir, Zn, In, Sn, Mg or oxides thereof, which may be blended with additives to increase conductivity thereof, such as aluminum. The transparent wavelength of the current spreading layer 28 depends on the light-emitting body used, so the lights generated by the light-emitting body may largely penetrate the current spreading layer 28.

In FIG. 2, the micro-structure layer 29 is a TiN layer with a nano-net structure and is not shown for clarity. Since the TiN nano-net structure includes considerably fine roughening structures, more photons generated by the semiconductor active layer 24 are output with emission angles smaller than a critical angle. As compared to the prior roughening structure, the micro-structure is much smaller, and hence the total reflection may be greatly reduced.

Further, a p-type electrode 40 is disposed on the micro-structure 29 and an n-type electrode 32 on the n-type GaN-based layer for supplying a current into the light-emitting body.

Figure 3:
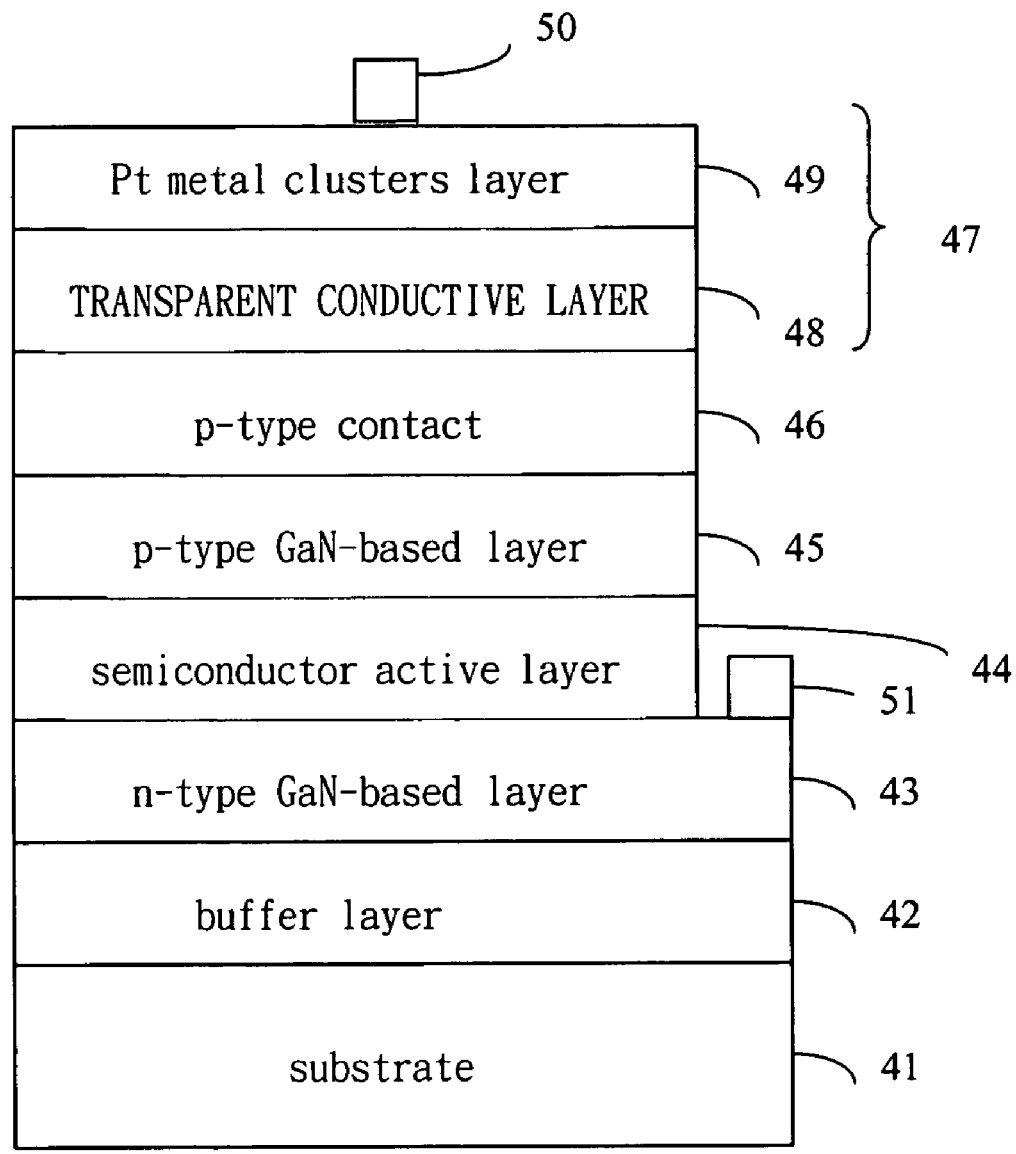
FIG. 3 is an illustration of a first device structure embodiment according to the present invention.

Referring to FIG. 3, which shows a second device embodiment according to the present invention, the device 40 comprises a substrate 41, a buffer layer 42, an n-type GaN-based layer 43, a semiconductor active layer 44, a p-type GaN-based layer 45, a p-type contact layer 46, a current spreading layer 48, a micro-structure layer 49 and electrodes 50, 51. The second device embodiment is the same as the first device embodiment except for the micro-structure layer 49 of the light extraction layer 47. In the embodiment, the micro-structure 49 is an annealed Pt layer with metal clusters, which is not shown for clarity. Similarly, since the dimension of the metal clusters is much smaller than that of the prior roughening structure, the number of photons emitted with an emission angle smaller than the critical angle increases greatly. Therefore, the light extraction efficiency may be considerably enhanced.

Figure 4:
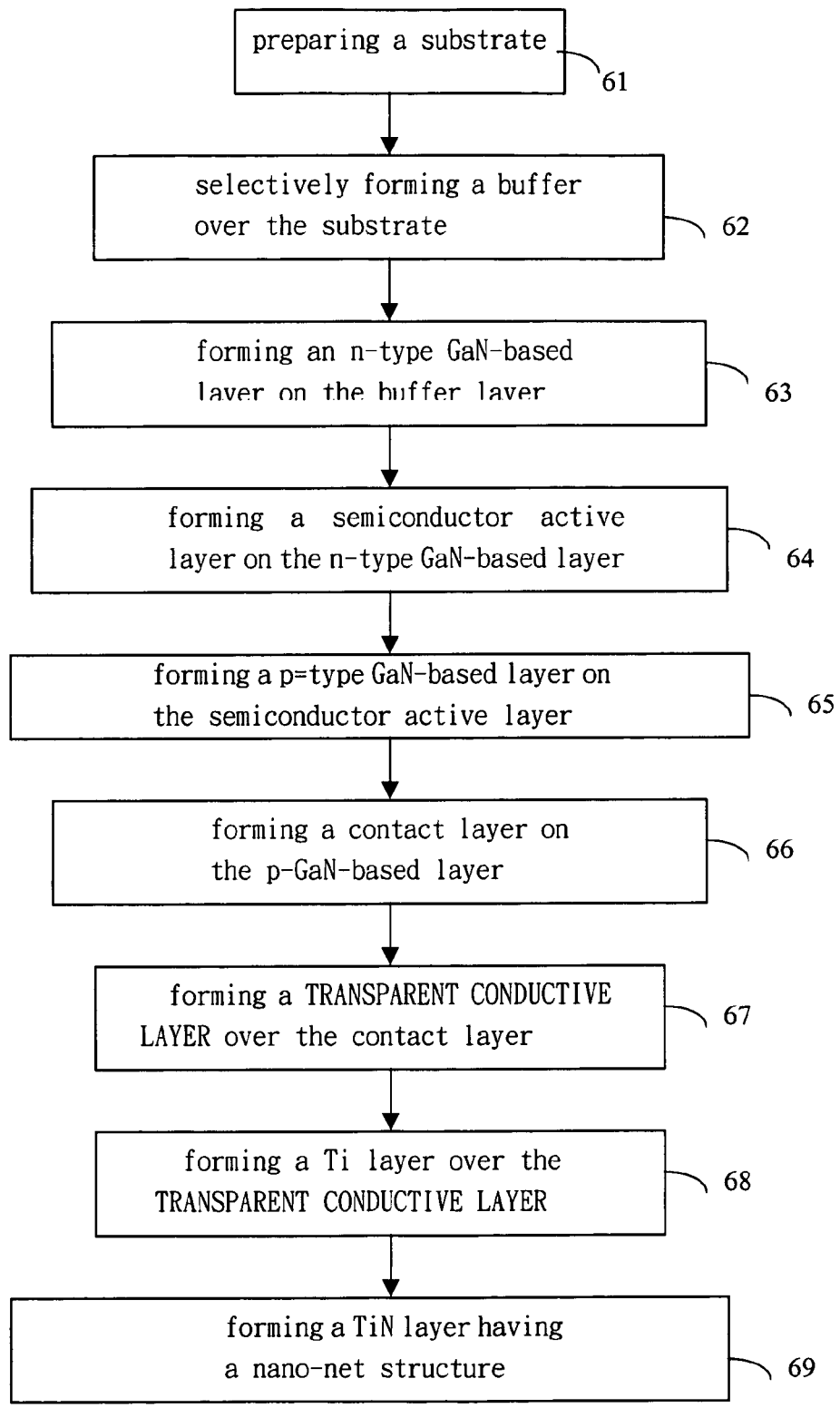
FIG. 4 is a first manufacturing method embodiment according to the present invention used to manufacture the first device structure according to the present invention.

Referring to FIG. 4, which illustrates a first manufacturing embodiment for the first device according to the present invention, a substrate is first prepared (61). Next, a buffer layer is selectively formed over the substrate (62) by a molecular beam epitaxial (MBE) method, metal organic chemical vapor deposition (MOCVD) or other suitable technologies. Next, an n-type GaN-based layer is formed over the buffer layer (63), and a semiconductor active layer is formed over the n-type GaN-based layer 66. Next, a current spreading layer is formed over the contact layer (67) and a Ti layer is formed over the current spreading layer (68). Next, the Ti layer is subjected to nitridation to form a TiN layer with a micro-structure (69). In addition, the micro-structure layer may be formed with a p-type electrode thereon and an n-type electrode may be formed over a portion of the n-type GaN-based layer.

Figure 5:
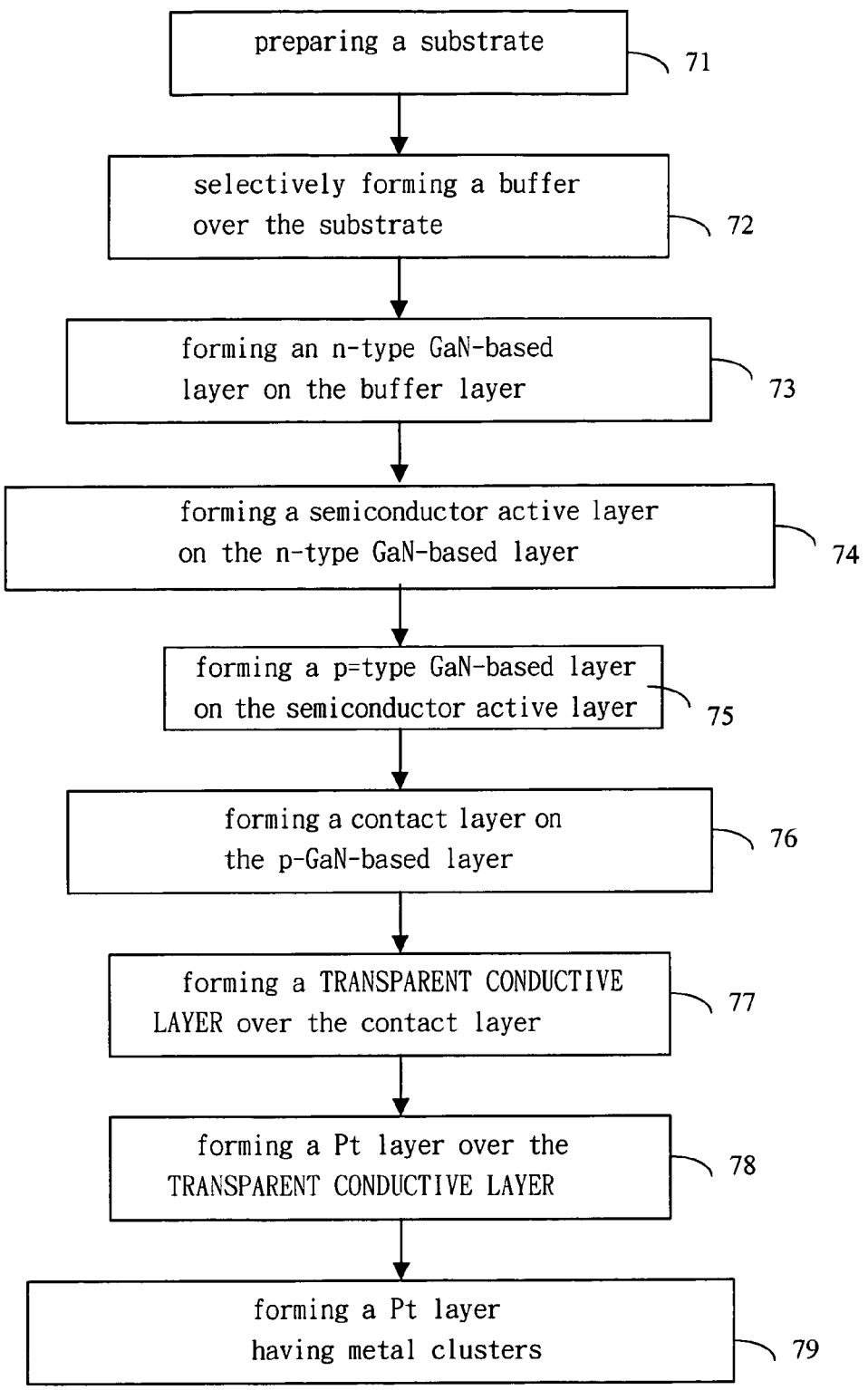
FIG. 5 is a second manufacturing method embodiment according to the present invention used to manufacture the second device structure according to the present invention.

Reference is made to FIG. 5, which shows a second manufacturing method embodiment for the second device according to the present invention. In the second manufacturing method, Step 71 to Step 77 is the same as Step 61 to Step 67 in FIG. 4. After Step 77, in which a current spreading layer is formed, a Pt layer is then formed over the current spreading layer (78). Then, the Pt layer is annealed to have a metal cluster formed thereon (79). In addition, a p-type electrode may be formed over the micro-structure layer and an n-type electrode may be formed over a portion of the n-type GaN-based layer.

Figure 6:
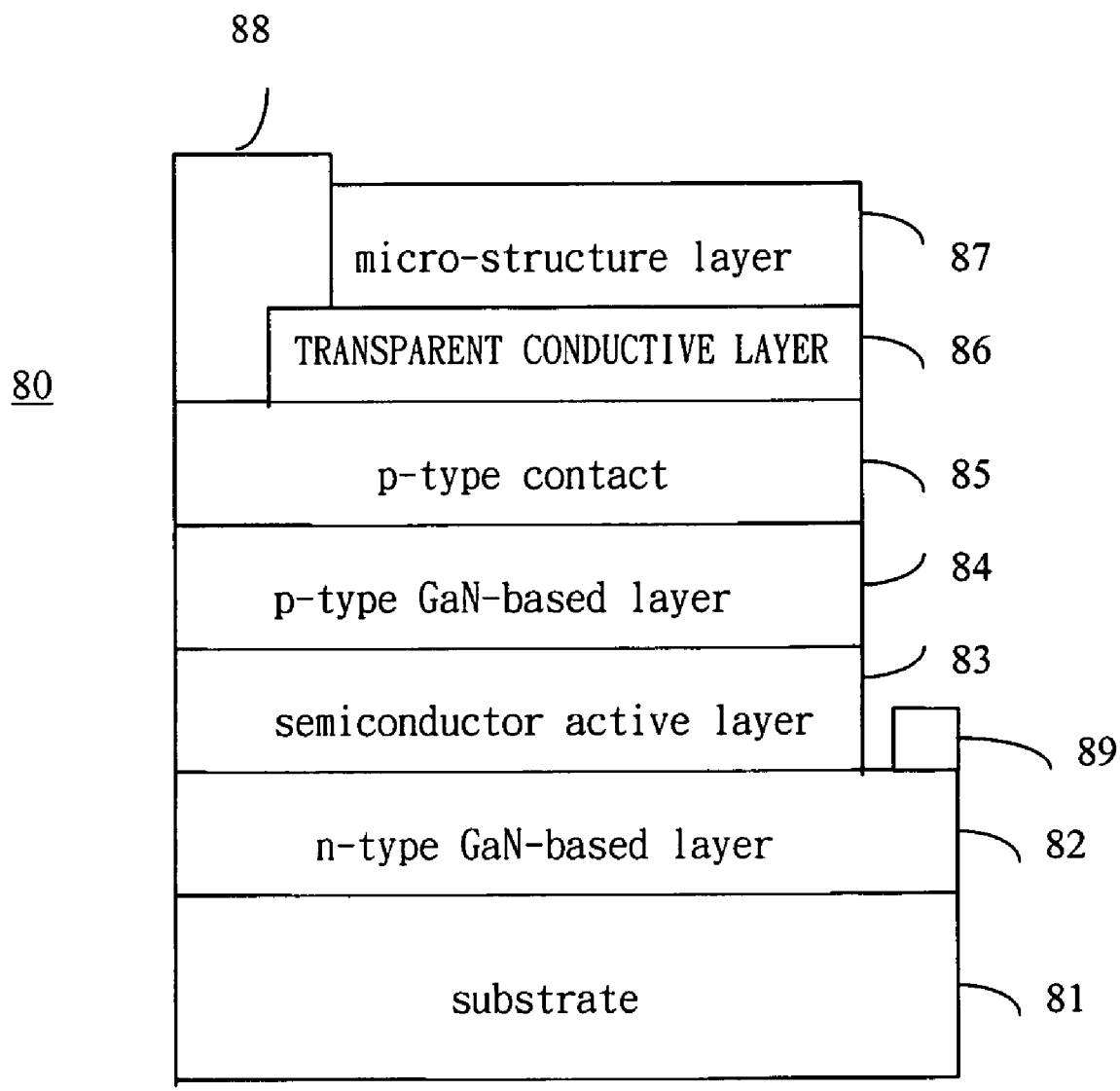
FIG. 6 is an illustration of an alternative LED with a micro-structure layer used according to the present invention.

FIG. 6 illustrates a light-emitting device structure 80 where a p-type metal electrode is disposed beside a current spreading layer 86 but not over the current spreading layer 86. The device structure 80 comprises a substrate 81, an n-type GaN-based layer 82, a semiconductor active layer 83, a p-type GaN-based layer 84, a p-type contact layer 85, a GaN-based current spreading layer 86 formed over the p-type contact layer 85, and a p-type metal electrode 88 disposed beside the GaN-based current spreading layer 86. In addition, an inventive micro-structure layer 87 is finally disposed on the GaN-based current spreading layer 86 and beside the metal electrode 88. In the device structure embodiment, since the micro-structure 87 is not involved with current spreading, the micro-structure 87 may be separately formed with the p-type metal electrode 88.

Figure 7:
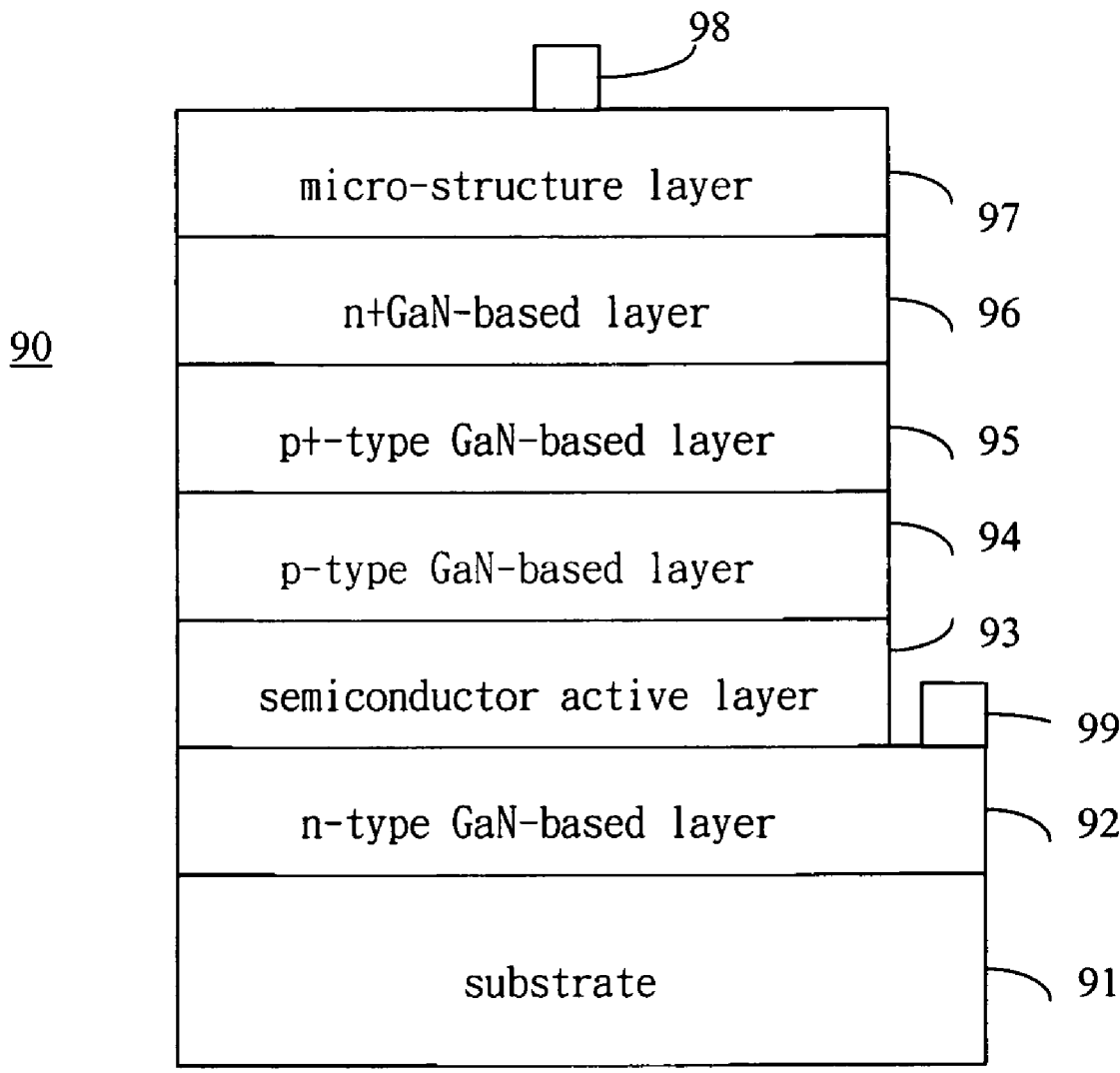
FIG. 7 is an illustration of a tunneling junction LED with the micro-structure layer used according to the present invention.

The inventive micro-structure with the above nano-net structure or metal clusters may be used in a tunneling junction structure 90, which is described in FIG. 7. In the figure, the structure 90 comprises a substrate 91, an n-type GaN-based layer 92, a semiconductor 93, p-type GaN-based layer 94 and a p+ and an n+-type GaN-based layer 95, 96. The p+-type GaN-based layer is disposed over the n+-type GaN-based layer 96 and the two layers 95, 96 will be referred to as a p+/n+-type GaN-based layer. Then, the inventive micro-structure 97 is directly disposed over the GaN-based layer 96 without need of the current spreading layer in the foregoing embodiments since the GaN-based layer 96 has electrons as its major carriers. However, a current spreading layer may also be selectively included in the structure 90. Finally, a p-type electrode is disposed on the micro-net structure 97 and an n-type electrode on the n-type GaN-based layer 92.

Figure 8:
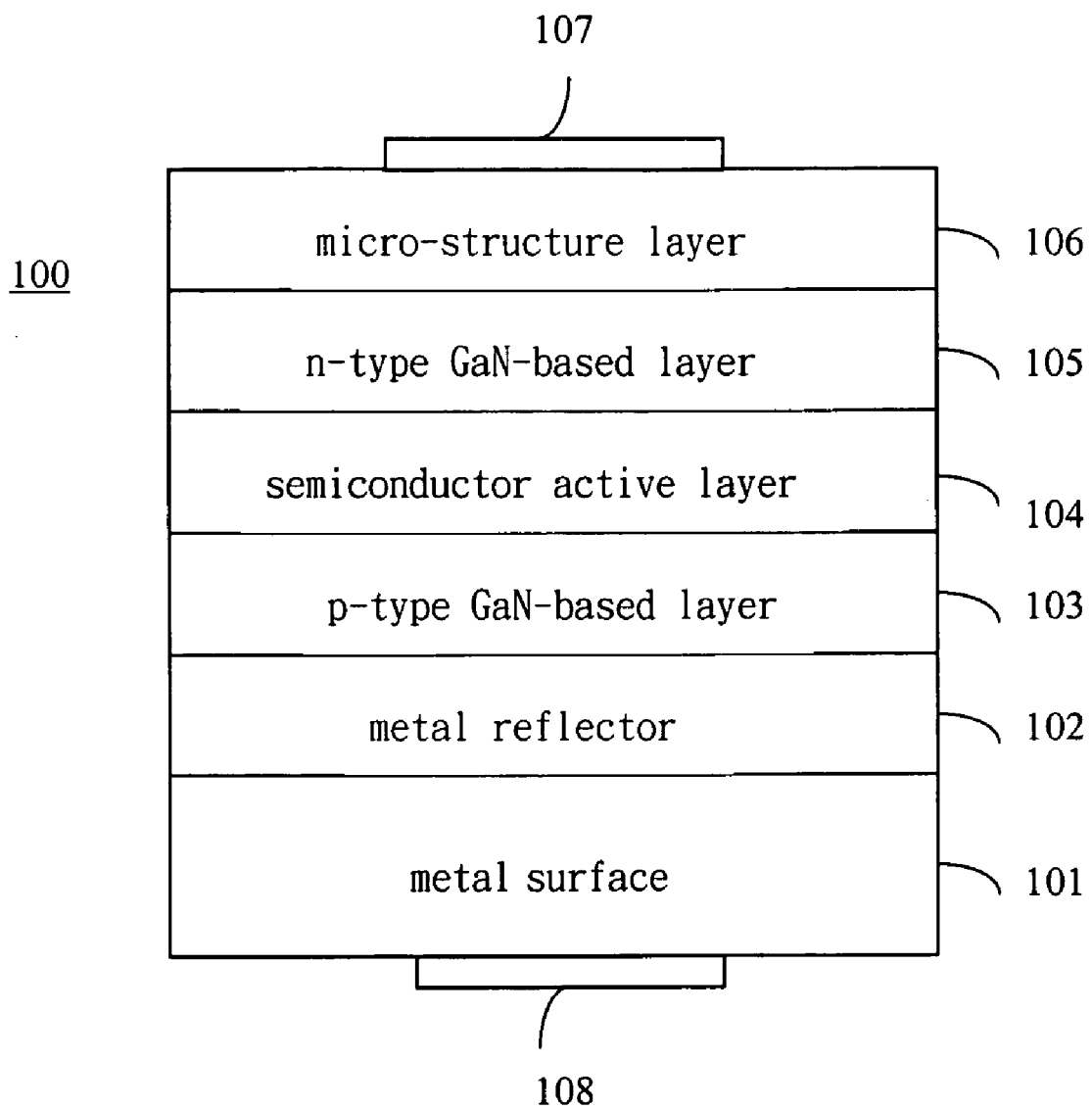
FIG. 8 an illustration of a vertical LED with the micro-structure layer used according to the present invention.

Referring to FIG. 8, the micro-structure layer according to the present invention is used in a vertical LED structure 100. In the figure, a metal reflective layer 102 is disposed over a substrate 101 to restrict the light generated by the p-type GaN-based layer 103, the semiconductor active layer 104 and the n-type GaN-based layer 105 above the metal reflective layer 102.

The substrate 101 is a conductive metallic material used to supply charges to the p-type GaN-based layer 103 since the n-type electrode 107 is disposed on the most upper part of the structure 100. In such a structure, since no low mobility issue of holes exists, no current spreading layer is required. A current spreading layer may be selectively incorporated. Therefore, the inventive micro-structure layer 106 may be formed directly over the n-type GaN-based layer 105. Then an n-type electrode 107 is disposed on the micro-structure layer 106.

In addition to the advantage of reduction of total reflection and improvement of light extraction efficiency, the manufacturing of the device structure of the present invention is not complicated and thus the light extraction layer of the present invention is suitable for use in any type of light emitting device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A gallium nitride (GaN) based light-emitting device (LED), comprising:
    a light-emitting body comprising a GaN-based material capable of emitting a light; and
    a light extraction layer comprising:
    a current spreading layer disposed over said light-emitting body; and
    a micro-structure layer disposed over said current spreading layer and being a Pt layer having metal clusters.

2. The LED according to claim 1, wherein said light-emitting body comprises an n-type GaN-based layer, a semiconductor active layer and a p-type GaN-based layer and said semiconductor active layer is disposed over said n-type GaN-based layer and said p-GaN-based layer is disposed over said active layer.

3. The LED according to claims 1 or 2, wherein said light-emitting body has a p-type electrode and an n-type electrode and said p-type electrode is disposed over said micro-structure layer.

4. The LED according to claim 3, wherein said p-type electrode is disposed beside said micro-structure layer and said current spreading layer.

5. The LED according to claim 1, wherein said Pt layer having metal clusters is formed by annealing a Pt layer.

* * * * *